United States Patent
Clarke

(10) Patent No.: US 9,013,296 B2
(45) Date of Patent: Apr. 21, 2015

(54) ELECTRICAL PANEL SAFETY MONITOR

(75) Inventor: Roger S. Clarke, Santa Claus, IN (US)

(73) Assignee: Automatic Timing and Controls Inc, Newell, WV (US)

( * ) Notice: Subject to any disclaimer, the term of this patent is extended or adjusted under 35 U.S.C. 154(b) by 77 days.

(21) Appl. No.: 13/398,952

(22) Filed: Feb. 17, 2012

(65) Prior Publication Data
US 2013/0214922 A1 Aug. 22, 2013

(51) Int. Cl.
G08B 29/00 (2006.01)
G01R 19/155 (2006.01)
G01R 19/00 (2006.01)

(52) U.S. Cl.
CPC .......... *G01R 19/155* (2013.01); *G01R 19/0084* (2013.01)

(58) Field of Classification Search
CPC ....................................................... G01R 31/02
USPC ............. 340/870.01, 807.02, 870.09, 870.18, 340/870.29, 915, 514; 324/523, 508, 522; 362/552, 554, 555
See application file for complete search history.

(56) References Cited

U.S. PATENT DOCUMENTS

| | | | | |
|---|---|---|---|---|
| 5,481,451 A * | 1/1996 | Kuwahara | ........................ | 363/37 |
| 5,877,618 A * | 3/1999 | Luebke et al. | ................. | 324/72.5 |
| 6,217,188 B1 * | 4/2001 | Wainwright et al. | ......... | 362/103 |
| 6,703,938 B1 * | 3/2004 | Clarke | .......................... | 340/664 |
| 2003/0059182 A1 * | 3/2003 | Johnson et al. | ................ | 385/112 |
| 2004/0257235 A1 * | 12/2004 | Right et al. | .................... | 340/628 |
| 2006/0008217 A1 * | 1/2006 | Ko | .................. | 385/115 |
| 2007/0081354 A1 * | 4/2007 | Wahlstrom | ..................... | 362/551 |
| 2007/0132458 A1 * | 6/2007 | Allen, Jr. | ....................... | 324/523 |
| 2007/0159739 A1 * | 7/2007 | Onachilla et al. | ............... | 361/42 |
| 2007/0258235 A1 * | 11/2007 | Brockel et al. | ................. | 362/190 |
| 2010/0014205 A1 * | 1/2010 | Gerlach | ......................... | 361/111 |
| 2010/0039279 A1 * | 2/2010 | Luebke et al. | ................. | 340/662 |
| 2010/0201194 A1 * | 8/2010 | Masciarelli et al. | ............ | 307/66 |
| 2010/0332896 A1 * | 12/2010 | Wilson et al. | .................... | 714/14 |
| 2012/0280832 A1 * | 11/2012 | Jonsson et al. | ............ | 340/870.02 |
| 2012/0293337 A1 * | 11/2012 | Carlsson | ........................ | 340/654 |

* cited by examiner

*Primary Examiner* — Hai Phan
*Assistant Examiner* — Zhen Y Wu
(74) *Attorney, Agent, or Firm* — Fay Sharpe LLP

(57) ABSTRACT

An electrical safety monitor for monitoring electrical energy potentials of one or more electrical power input lines of an A.C. circuit. The electrical safety monitor including one or more detector circuits, each including one or more capacitors corresponding to one or more electrical power input lines arranged to charge responsive to an electrical energy potential on the corresponding line and a discharge circuit electrically communicating with the one or more capacitors to cause a capacitor discharge at a predetermined capacitor voltage. A plurality of solid-state light-emitting devices disposed in a human-viewable arrangement, each light emitting device electrically communicating with a selected capacitor and producing a light output responsive to capacitor discharge of the corresponding capacitor. A testing circuit generates a test current through the one or more detectors circuits providing verification of the electrical safety monitor integrity.

22 Claims, 4 Drawing Sheets

ELECTRICAL PANEL SAFETY MONITOR

BACKGROUND

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

To ensure safety during servicing of electrical systems and circuits which carry high voltages, a "lockout/tagout" procedure is typically followed. A circuit breaker or ON/OFF switch that delivers power to the circuit to be serviced is opened or disengaged to disconnect electrical power from the circuit, and the breaker is physically locked into the opened or disengaged position using a padlock or other device (the "lockout"). Additionally, the servicing electrician affixes a tag to the physically locked breaker that provides information such as the electricians' identity and contact information, service authorization information, and the like (the "tagout"). The tag typically is bright red or otherwise prominently displayed, and includes a plain language warning that only the installing electrician is authorized to remove the lockout/tagout and reenergize the circuit.

The lockout/tagout procedure greatly reduces the possibility of human error causing inadvertent application of power to the circuit under service. However, safety can be compromised even when the lockout/tagout procedure is properly followed, due to various potential sources of dangerously high voltages in the isolated circuit. For example, potential unexpected sources of DC energy include line capacitance, bypass capacitors, or power factor correction banks. Potential unexpected sources of AC energy include standby power generators, motor back-EMF, or human operation of an associated switch. Moreover, power ON/OFF switches or circuit breakers are not immune to failure, and the locked out breaker could potentially still be transmitting power.

Recognizing that the most dangerous power panel or box can be the one believed to be at zero energy potential, the Occupational Safety and Health Administration (OSHA) has issued regulation OSHA 1910.147 entitled "Control of Hazardous Energy (Lockout/Tagout)" which includes identification of residual or stored energy as a hazard. OSHA 1910.147 requires that electrical isolation be verified after lockout/tagout (LOTO). Furthermore, it requires that the verification of isolation continue throughout the electrical servicing if there is a possibility of reaccumulation of hazardous levels of stored energy.

To verify electrical isolation, electrical safety monitors which monitor electrical energy potentials of monitored electrical lines of an electrical panel are utilized. The electrical safety monitors provide a warning with light emitting diode ("LED") indicators in response to an electrical potential being present on the monitored lines. During servicing, electricians verify normal operation of the indicators while the panel is powered and then verify all of the indicators are extinguished while the panel is powered down before opening the panel. Although electrical safety monitors have proven to be reliable, final verification by lack of illumination provides less assurance than desired due to the possibility of circuit failure or malfunction which could likewise be the culprit for extinguished indicators and not just the absence of voltage on the monitored lines.

Additionally, although the operating current required for indication is extremely low, typically less than 1 milliampere at 750VAC 3-phase, the electrical safety monitors are rated for 750VAC continuous operation and the monitored line voltages entering the monitor are at full 3-phase line voltage potentials. To further electrical isolate the electrical safety monitors due to the high energy potential during operation, the housing of these monitors are typically non-conductive and the electronics are fully encapsulated in a high quality thermoset potting compound. It is desired to have the electrical safety monitor include a separate internally mounted electrical package and an isolated remote display adaptor mounted in the panel to provide indication when an electrical potential is present on the monitored lines.

The following contemplates an improved apparatus and method that overcomes the aforementioned limitations and others.

BRIEF DESCRIPTION

In accordance with one aspect of the present exemplary embodiment, an electrical safety monitor for monitoring electrical energy potentials of one or more electrical power input lines of an A.C. circuit is provided. The electrical safety monitor including one or more detector circuits, each of the detector circuits includes one or more capacitors corresponding to one or more electrical power input lines, each capacitor arranged to charge responsive to an electrical energy potential on the corresponding line and a discharge circuit electrically communicating with the one or more capacitors to cause a capacitor discharge at a predetermined capacitor voltage. A plurality of solid-state light-emitting devices disposed in a human-viewable arrangement, each light emitting device electrically communicating with a selected capacitor and producing a light output responsive to capacitor discharge of the corresponding capacitor. A testing circuit arranged to generate a test current through the one or more detectors circuits providing verification of the electrical safety monitor integrity.

In accordance with another aspect of the present exemplary embodiment, an electrical safety monitor for providing warning of a hazardous electrical voltage on a circuit powered by a plurality of electrical power input lines is provided. The safety monitor includes an electronics package. The electronic package includes one or more detector circuits. Each of the detector circuits including one or more capacitors corresponding to one or more electrical power input lines, each capacitor arranged to charge responsive to an electrical energy potential on the corresponding line, and a discharge circuit electrically communicating with the one or more capacitors to cause a capacitor discharge at a predetermined capacitor voltage. A plurality of solid-state light-emitting devices disposed in a human-viewable arrangement, each light emitting device electrically communicating with a selected capacitor and producing a light output responsive to capacitor discharge of the corresponding capacitor. A remote display adaptor includes one or more lenses in communication with the plurality of solid-state light-emitting devices via fiber optic cables.

In accordance with another aspect of the present exemplary embodiment, a method for testing operation of an electrical safety monitoring device is provided. The method including observing one or more light emitting diode (LED) indicators of the electrical safety monitoring device are normally indicating according to applied power on one or more monitored lines, observing one or more LED indicators of the electrical safety monitoring device are extinguished after the applied power is disconnected from the one or more monitored lines, and verifying one or more internal indicator circuits of the electrical safety monitoring device are functional by providing a test current through the one or more indicator circuits by a testing circuit.

DETAILED DESCRIPTION

Figure 1:
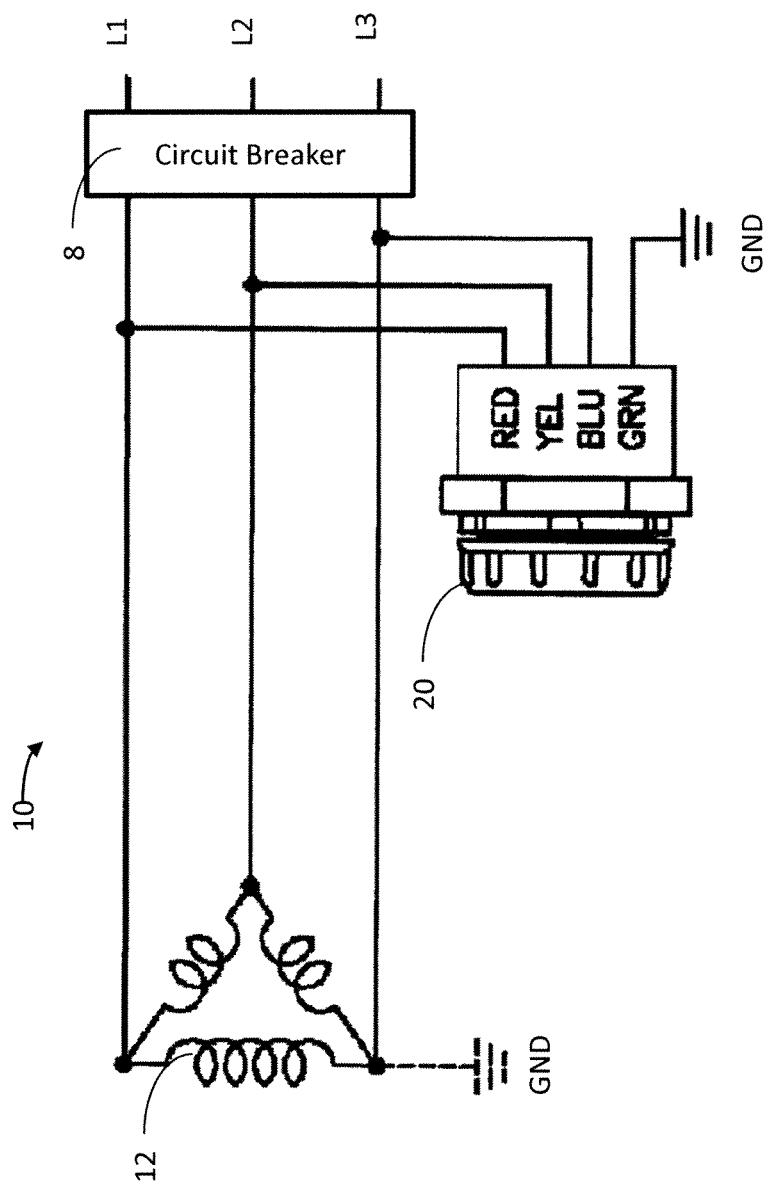
FIG. 1 illustrates an electrical schematic of a three-phase electrical power circuit under service, along with an electrical safety monitoring device.

With reference to FIG. 1, a circuit 10 to be serviced includes a three-phase load 12 that is driven through lines L1, L2, L3 by three-phase power relative to a ground potential GND. The three-phase power is presently disconnected via a circuit breaker or ON/OFF switch 8 such that the lines L1, L2, L3 are intended to be electrically isolated and at zero potential, in preparation for electrical service. It should also be contemplated that the circuit 10 includes a single-phase two-wire load 12 that is driven through power line L1 and neutral N by single-phase power relative to the ground potential GND. It is further contemplated that the circuit 10 includes a single-phase three-wire load 12 that is driven through differential power lines L1, L2 and neutral N by single-phase power relative to a ground potential GND.

However, it is understood that one or more of the lines L1, L2, L3 may carry substantial or even lethal D.C. or A.C. electrical energy potentials due to charged capacitances in the load 12, undischarged power factor correction banks, standby power generators, motor back-EMF voltages, power sources that inadvertently remain energized and/or connected to the circuit 10 through human error or mechanical failure, or the like. These electrical energy potentials may exist between the lines L1, L2, L3 and/or between one or more of the lines L1, L2, L3 and the ground potential GND.

An electrical safety monitoring device 20 monitors the lines L1, L2, L3 as well as neutral (N) and ground (GND) to detect hazardous energy potentials. The safety monitoring device 20 includes LEDs, each which is illuminated if there is an electrical potential between a corresponding pair of the lines L1, L2, L3, N, and GND. In one embodiment, the electrical safety monitor device 20 includes an imbedded reed switch, other remotely operated switching device, and the like which is magnetically actuated by an operator and initiates a circuit test operation which provides visual indication of electrical safety monitoring device 20 integrity and functional operation. Following a standard LOTO power disconnect, the magnetically activated test ("MAT") provides electricians means of assurance that although all power indicators on the electrical safety monitoring device 20 have been verified to be extinguished, the power indicators are operational. The reed switch causes all LEDs to be illuminated to show that no LEDs are giving a false indication of no potential (dark) by virtue of being burned out or a circuit malfunction. The circuits driving the LED indicators and the electrical safety monitoring device 20 itself must be proved to remain fully functional and capable of indication should a dangerous potential still be present on monitored lines. To accomplish this, the MAT utilizes a low level capacitive charge to pass energy through all of the detection circuits of the electrical safety monitoring device 20 which causes all of the LED indicators to illuminate and provide a visual indication to the electrician that the device is still in good operating order. After the test and with all LED indicators extinguished, the electrician has verified device integrity as well as zero energy on monitored lines. The MAT also performs a full device functionality test while power remains on. It is not unexpected for electricians to question if the detection circuits for the indicators are operational when those indicators are normally extinguished for the power system they are monitoring. The MAT provides the assurance of functionality without any ill effect on the monitored lines since the test current is combined electronically with the input currents received from monitored lines such that the received power can remain undisturbed.

Specifically, during normal operation of the electrical safety monitoring device 20 while the panel is energized, operation of any number of suspect extinguished indicators can be tested for operation by momentary or maintaining magnetic activation of reed switch (SW1). Indicators already receiving current from the input wires (typically L1, L2, and L3) are illuminated and may retain higher intensity or flash rate levels than extinguished indicators (typically N, GND) which receive limited test current from the internal storage capacitance during the test period.

As mentioned above, during normal powered conditions, it is common for the L1, L2, and L3 pairs to be illuminated and the GND and N indicator pairs to be extinguished. This peculiarity occurs when Delta or Wye 3-Phase systems are in a balanced state where the net current in the neutral line is nulled to zero. With the indicators being actually current driven (currents produced from input potentials), no net current flows in the N or GND input wires since the device is also internally balanced with equal value series input power resistors on each incoming line. Therefore, the respective N and GND indicator pairs correctly do not illuminate. Besides non-illumination from nulled N and GND currents in balanced systems, the GND (ground) indicator pair would also not receive current (be extinguished) from a fully isolated ground system even during unbalance since the ground current path is open. Only a leakage failure to ground would allow current flow. For grounded neutral systems, the Neutral and GND are very close to the same potential and eventually connect together. When the current in the N does occur, the device will equally divide the current between both the N and GND indicator pairs and will illuminate once the respective input current exceeds the "GND DETECTOR THRESHOLD" specification in micro-amperes.

Both neutral grounded systems and High Resistance Grounding (HRG) systems with neutral to ground resistor do have current paths in order for the N or GND indicator pairs to illuminate but only during abnormal conditions such as voltage unbalance or leakage conditions. A leakage condition may occur from load winding insulation breakdown, conductor insulation failure or contaminants providing a leakage current path either from a phase to neutral or earth ground resulting in the abnormal N and GND indication. Whether the currents are produced from an unbalance condition or leakage, both indicator pairs designated N (neutral) and GND (ground) will illuminate once the leakage current level exceeds the "GND DETECTOR THRESHOLD" specification. It should be noted that although unbalance or leakage conditions can cause illumination of indicators, the device is not specifically designed as a detector for these conditions.

During servicing of the electrical safety monitoring device 20 or any shut down when power is removed from a panel, transients and surges occurring on the lines are not uncommon. After following all applicable LOTO safety procedures and power has been turned off, all of the indicators are observed to be off as to verify absence of electrical potential on the monitored lines. Before the electrical panel is opened, a MAT is performed to test the functionality and integrity of the electrical safety monitoring device 20. During the MAT, a status indicator flashes green (green signifies GO for the test and adequate internal storage charge) during which all indicators are observed for illumination. Illumination of all LED indicators signifies the internal circuitry is fully operational. After the green status indicator extinguishes, the internal test current source is removed and the indicators should immediately extinguish, provided all input power to the device is also removed.

The MAT feature also proves very valuable when normal line conditions are yet present by verifying operation of questionable extinguished indicators. After magnetic activation of the reed switch initiates the test, the internal storage capacitance sources test currents and parallels them with any incoming external input current by diode array to all of the indicator circuits. Therefore, according to power conditions, input current from energized monitored lines may occur simultaneously during test. Those indicators normally extinguished will likely only be receiving current from the MAT circuit storage capacitance and may appear dimmer while normally illuminated indicators, receiving both external source current and test current, may appear brighter in comparison. Only when one or more of the indicators FAIL to illuminate during the duration of the test period, as defined by the status indicator flashing green, should the user be concerned with internal circuit failure. For final determination of possible malfunction, the test is conducted again after power disconnect while the status indicator yet flashes green and not yellow.

Figure 2:
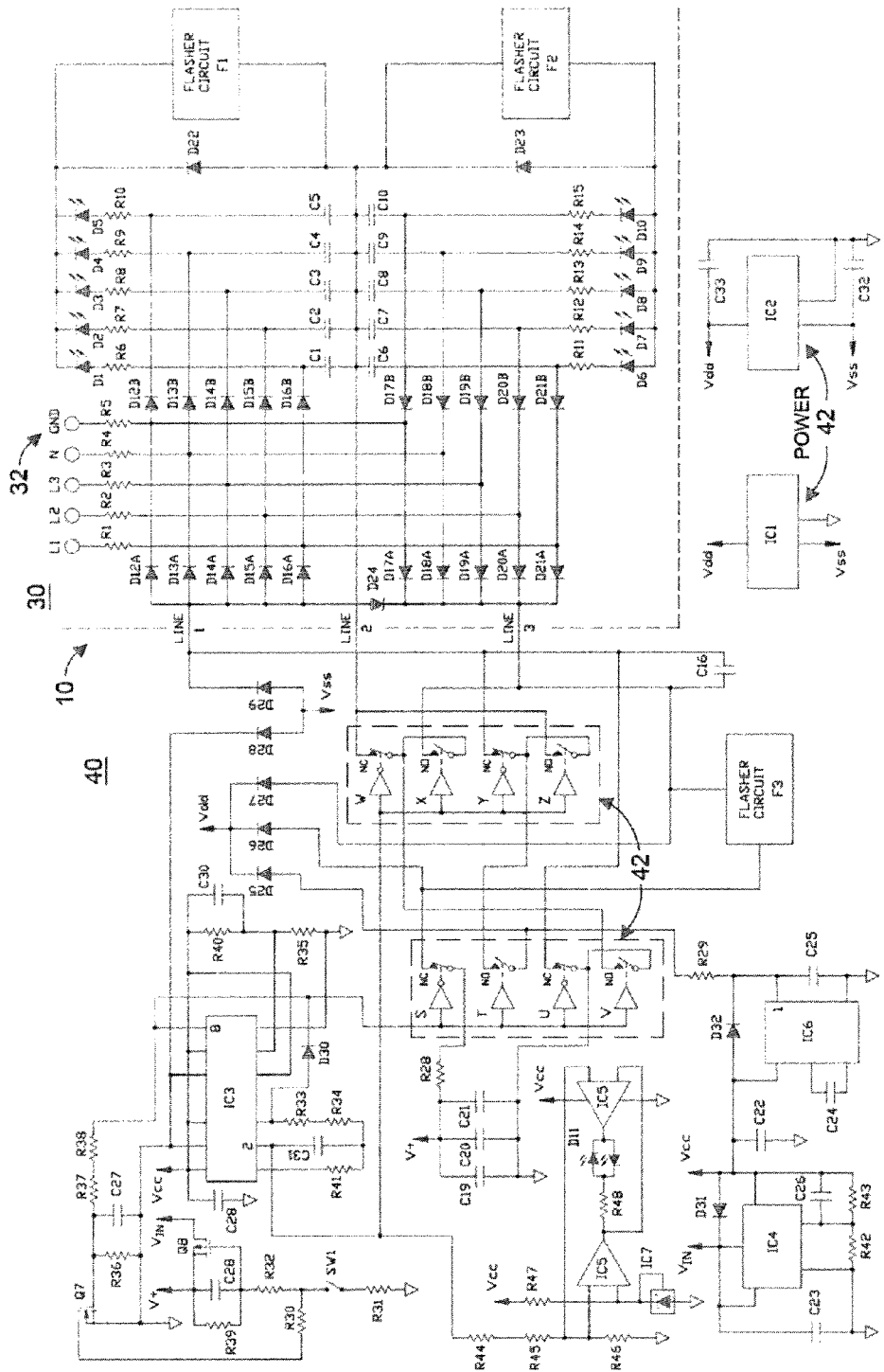
FIG. 2 illustrates an electrical schematic of circuitry of the electrical safety monitor of FIG. 1.

With continuing reference to FIG. 1 and with further reference to FIG. 2, an electrical safety monitoring device 20 monitors the lines L1, L2, L3, N and the ground potential GND to detect hazardous energy potentials. The electrical safety monitoring device 20 includes indicator electrical circuitry 30 shown in FIG. 2. The circuitry 30 includes a plurality of light emitting devices which are preferably light emitting diodes. Specifically, the circuitry 30 includes light emitting diodes D1, D2, D3, D4, D5, D6, D7, D8, D9, D10 and corresponding capacitances C1, C2, C3, C4, C5, C6, C7, C8, C9, C10. The light emitting diodes D1, D2, D3, D4, D5, D6, D7, D8, D9, D10 and capacitances C1, C2, C3, C4, C5, C6, C7, C8, C9, C10 are protected by zener diodes D22, D23 which limit voltages over these elements. Additional protective elements include a third zener diode D24 and diodes D12A, D13A, D14A, D15A, D16A, D17A, D18A, D19A, D20A, D21A, D12B, D13B, D14B, D15B, D16B, D17B, D18B, D19B, D20B, D21B, which limit voltage over the capacitances C1, C2, C3, C4, C5, C6, C7, C8, C9, C10.

The light emitting diodes D1, D2, D3, D4, D5, D6, D7, D8, D9, D10 and corresponding capacitances C1, C2, C3, C4, C5, C6, C7, C8, C9, C10 are separated into two groups. A first or upper group 32 of light emitting diodes including the light emitting diodes D1, D2, D3, D4, D5 along with corresponding capacitors C1, C2, C3, C4, C5 and resistors R6, R7, R8, R9, R10. The first group 32 is arranged to draw current to positively charged lines and to produce light indicating lines with a positive potential with respect to one or more other lines. A second or lower group 34 of light emitting diodes including the light emitting diodes D6, D7, D8, D9, D10 along with corresponding capacitors C6, C7, C8, C9, C10 and resistors R11, R12, R13, R14, R15. The second group 34 is arranged to draw current from negatively charged lines and to produce light indicating lines with a negative potential with respect to one or more other lines.

The potentials on the lines L1, L2, L3, N and the ground potential GND are fed into the circuitry 30 via high impedance resistances R1, R2, R3, R4, R5 respectively. In a preferred embodiment, the resistances R1, R2, R3, R4, R5 are each 470 kilo-ohms to ensure a high input impedance of the circuitry 30 to the circuit 10 under service. The high input impedance prevents hazardous electrical energy from entering the electrical safety monitoring device 20 and allows closely spaced low voltage and low current components to be used in constructing the circuitry 30.

In operation, high impedance paths are defined between each pair of the lines L1, L2, L3, N and the ground potential GND.

For example, if an electrical potential exists between L1 and GND with L1 being positive relative to GND, then a high impedance path including resistance R1, a diode D16B, capacitances C1, C10, a diode D17B, and resistance R5 conducts current flowing from L1 to GND. The current flow charges the capacitance C1 which is associated with the light emitting diode D1 of the first or positive group 32, and also charges the capacitance C10 which is associated with the light emitting diode D10 of the second or negative group 34.

The capacitor C1 charges until it reaches a threshold voltage which triggers a discharge or flash circuit F1 associated with the light emitting diodes D1, D2, D3, D4, D5 of the first group 32, at which point F1 switches from a high impedance state to a low impedance state. In a preferred embodiment, the threshold voltage for triggering the flash circuit F1 is about 5 volts. The flash circuit F1 in its low impedance state discharges the capacitor C1 through the light emitting diode D1, and the discharge current causes the light emitting diode D1 to produce light.

Similarly, the capacitor C10 charges until it reaches a threshold voltage which triggers a flash circuit F2 associated with the light emitting diodes D6, D7, D8, D9, D10 of the second group 34, at which point F2 switches from a high impedance state to a low impedance state. Preferably, the flash circuit F2 is substantially similar to the flash circuit F1, and also has a threshold voltage of about 5 volts. The flash circuit F2 in its low impedance state discharges the capacitor C10 through the light emitting diode D10, and the discharge current causes the light emitting diode D10 to produce light.

On the other hand, if an electrical potential exists between GND and L1 with GND being positive relative to L1, then a high impedance path including resistance R5, a diode D12B, capacitances C5, C6, a diode D21B, and resistance R1 conducts current flowing from GND to L1. The current flow charges the capacitance C5 which is associated with the light emitting diode D5 of the first or positive group 32, and also charges the capacitance C6 which is associated with the light emitting diode D6 of the second or negative group 34.

It will be particularly appreciated that the various high impedance paths are rectifying paths. That is, current flows through different high impedance paths depending upon which line of a particular pair of lines is relatively positively charged, and which line of the particular pair of lines is relatively negatively charged.

Put another way, the rectifier diodes D12B, D13B, D14B, D15B, D16B allow a positive potential on one of the corresponding input lines L1, L2, L3, N GND to charge one of the respective capacitances C1, C2, C3, C4, C5. Likewise, rectifier diodes D17B, D18B, D19B, D20B, D21B allow a negative potential on one of the input lines L1, L2, L3, N GND to charge one of the respective capacitances C6, C7, C8, C9, C10. Each of the positive potential-responding capacitances C1, C2, C3, C4, C5 of the first group 32 has a respective positive light emitting diode D1, D2, D3, D4, D5 and each negative potential-responding capacitance C6, C7, C8, C9, C10 of the second group 34 has a respective negative light emitting diode D6, D7, D8, D9, D10. Each of the light emitting diodes D1, D2, D3, D4, D5, D6, D7, D8, D9, D10 has a corresponding series current-limiting resistor R6, R7, R8, R9, R10, R11, R12, R13, R14, R15. Two independent discharge or flasher circuits F1, F2 is with high "OFF" impedance and low "ON" impedance are coupled to the first and second (or positive and negative) groups 32, 34, respectively. The capacitances C1, C2, C3, C4, D5 and corresponding light emitting diodes D1, D2, D3, D4, D5 of the first or positive group 32 are in parallel so that when the flasher circuit F1 goes to a low or "ON" impedance, the stored energy on the capacitances C1, C2, C3, C4, C5 is discharged through the corresponding light emitting diodes D1, D2, D3, D4, D5. The second flasher circuit F2 operates on the negative responding components the same way.

A single D.C. potential between any two of the input lines L1, L2, L3, N, GND is indicated by one of the positive light emitting diodes D1, D2, D3, D4, D5 of the first group 32 and by one of the negative light emitting diodes D6, D7, D8, D9, D10 of the second group 34. Thus, a single D.C. potential between two lines is indicated by two flashing light emitting diodes.

An A.C. potential between any two of the input lines L1, L2, L3, N, GND produces a first half-cycle in which the two lines have a first polarity (that is, a first line being positive with respect to a second line), and a second half-cycle in which the two lines have a second and opposite polarity (that is, the second line being positive with respect to the first line). During the first half-cycle, the positive light emitting diode of the first line and the negative light emitting diode of the second line are having their respective capacitors charged. During the second half-cycle, the positive light emitting diode of the second line and the negative light emitting diode of the first line are having their respective capacitors charged. Hence, an A.C. potential between any two of the input lines L1, L2, L3, N, GND is indicated by flashing of both the positive light emitting diode and the negative light emitting diode of each of the two input lines, that is by a total of four flashing light emitting diodes.

It is therefore seen that the type of stored electrical energy potential (A.C. or D.C.), the polarity (for a D.C. potential), the lines on which the electrical energy potential resides, and an estimate of a magnitude of the electrical energy potential are all readily and intuitively identified by the electrical safety monitoring device 20 which employs the circuitry 30.

The circuitry 30 includes substantial redundancy. The first and second groups 32, 34 (that is, the positive and negative flasher-capacitor-light emitting diode circuits 32, 34) are independent, and so even in the event that one of the flasher circuits 32, 34 fails, the remaining flasher circuit remains operational and ensures that at one light emitting diode will flash for a D.C. potential, and at least two light emitting diodes will flash for an A.C. potential.

The circuitry 30 has an advantageous symmetrical configuration. The symmetry ensures proper operation for any three-phrase sequence. Additionally, if the input lines L1, L2, L3, N, GND are connected incorrectly, the circuitry 30 will still detect hazardous electrical energy potentials. However, incorrect connection of the lines may result in misidentification of lines carrying the electrical energy potentials. Furthermore, the symmetry facilitates straightforward adaptation of the circuitry 30 for monitoring of other types of panels and circuits.

Although the circuitry 30 is configured for visual monitoring via the light emitting diodes D1, D2, D3, D4, D5, D6, D7, D8, D9, D10 it is also contemplated to substitute or additionally include remote monitoring capability. For example, optocoupler inputs can be electrically arranged in series with the discharge circuits F1, F2 to produce optocoupler signals for electrically isolated remote monitoring. Placing optocoupler inputs in series with each flasher F1, F2 provides advantageous redundancy. The outputs of the optocouplers are preferably paralleled for monitoring by a programmable logic controller (PLC) or other monitoring device. The solid state relay optocouplers produce a signal pulse responsive to each capacitor discharge that is communicated to the PLC or other remote monitoring device.

With continuing reference to FIG. 2, the electrical safety monitoring device 20 also monitors the integrity and functional operation of the electrical safety monitoring device 20. The electrical safety monitoring device 20 includes MAT circuitry 40 shown in FIG. 2. The MAT circuitry 40 provides the electrician an operational test verification function. To verify all of the internal detection circuits are still fully operational and have not suffered damage after disconnect, the MAT circuitry 40 utilizes an internal storage capacitance charge to pass a momentary test current through all of the detection circuits providing sufficient time for the electrician to verify illumination of all indicators. Verification of zero energy before a panel is opened for access is now enhanced by including means of verification of electrical safety monitoring device 20 operation integrity. Operation of the MAT is performed by bringing a magnet, such as magnet commonly on the end of pocket tool screwdrivers and the like, to the vicinity of the target area printed on the front of the electrical safety monitoring device 20. The magnetic field will cause a closure of an internal reed switch SW1 which initiates the MAT. Notification of successful test activation is indicated by illumination of a bicolor status light emitting diode D11. For example, D11 flashes green when the normally open reed switch SW1 first closes, providing feedback to the operator.

Once the operator magnetically activates the normally open reed switch SW1, the first moment of closure functions as a one-shot timer and is electronically locked on until the test period ends. This prevents unrestricted test durations should the switch be inadvertently held on or subsequent closures during test would otherwise unnecessarily prolong the test. Storage charge is therefore conserved so if the need to run a subsequent test is necessary, adequate charge is more likely to still remain without the necessity of re-applying power for a recharge.

The MAT circuitry 40 channels current to storage capacitors C19, C20, C21 from a small charge transfer capacitance C16 that is charged when A.C. single phase, multi-phase, or a DC potential is applied between at least two of the five input lines L1, L2, L3, N, GND. The amount of storage charge and the duration of the charge is limited but optimized by the MAT circuitry 40 for micro power current demand in the standby mode should input lines remain de-energized. Standby micro power demand becomes very significant for extended power disconnect durations; for example, should the electrician be only available after a subsequent day or days to operate the MAT. Standby duration time is dependent on several factors, initial charge level, capacitor temperature, total capacitance value, allowable capacitor size, current demand, and the like. In order to gauge the capacitor's charge voltage level, the status indicator LED D11 alerts the user by flashing YELLOW when the charge level is deemed inadequate to perform the test. As the charge continues to deplete, eventually the yellow indicator will not illuminate. The status LED flashing yellow also indicates that in order to perform the test, power must be momentarily re-applied for recharge but only after following all pertinent safety precautions.

When voltage occurs between any two or more of the five input lines, L1, L2, L3, N, and GND, greater than the detection threshold voltages, the MAT circuitry 40 receives current from the full wave rectifier diodes D12A-D21A. The rectified potential provides a continual source for charging capacitor C16 which provides a limited charge reservoir used to dump charge into the much larger storage capacitance C19-C21 over a period of multiple pulses through the flasher circuit F3. After charging, C16 remains static until a momentary closure of reed switch SW1 activates the circuit. The dedicated positive and negative Vdd and Vss supply for IC1 and IC2 receives input current through D27 and D29. D25, D26, and D28 which act as protection diodes. The potential charge on C16 is transferred through D27 and D29 to Vdd and Vss during the on duty cycles of the series flasher circuit F3. Voltage to Vcc and Vss then allows operation of IC1 and IC2 solid state SPST switches 42 controlling input and output connections to be active while remaining ICs, IC3-IC6 can remain in standby mode, unpowered and rationing the current demand. With IC3 unpowered and therefore the output of pins 2 and 8 low, control inputs IC1 and IC2 are logic 0. The current path for supplying a second independent supply, V+ and circuit common, is then provided through SPST with switch U connecting the common back to the negative of voltage source capacitor C16 and switch S connecting V+ current limiting resistor R28 back to C16 positive during flasher circuit F3 'ON' cycles. The on/off action of flasher circuit F3 allows current sharing for critical simultaneous operation of both sections of the entire circuit: the MAT circuitry 40 and the indicator circuitry 30. Any delay in indication could convey a false impression to the end user that conditions are at zero energy when they are actually not so. It is critical that the initial low impedance and major current demand of storage capacitance C19-C21 is limited and duty cycled by the circuit to allow rationed current to the electrical safety monitoring device 20.

As the charge on C19-C21 is increased by duty cycled charge transferred from capacitor C16, potential voltage will eventually top off on the V+ supply, the amplitude limited by main protection zener D24 and series component losses. By limiting usage of the V+ supply to provide power only to the portion of the circuit to detect activation of the reed switch (SW1), current draw on the V+ source or storage capacitance becomes almost null during standby mode since associated transistors Q7 & Q8 are also in the off state as well as switch SW1, being normally open. The minimal current consumption scheme on V+ is still realized regardless of unit input power conditions. Therefore, the extremely low device standby quiescent current becomes responsible for an extended and long term panel disconnect period before a MAT is performed while keeping storage capacitance size and the necessary charge time minimal.

The source of power for the test comes from reliable internally encapsulated storage capacitors C19-C21 as opposed to less reliable batteries, photovoltaics, or incorporating a mechanically operated generator which could lose seal from the environment and corrode, present an isolation hazard and/or suffer damage or general wear. It is also contemplated that other charge storage devices, batteries, photovoltaics, or a mechanically operated generator provide power for the MAT. Since the recommended procedure toward zero energy verification first involves observing normal indication from the unit while power is on, this step provides the opportunity for the storage capacitors to receive charge. Charge is received when AC single phase, multi-phase, or a DC potential is applied for a finite time between at least two of the input lines. The voltage level between lines must exceed the minimum detection threshold voltage (typically ranging from 14-40V).

When the MAT is initiated and SW1 first closes, Q8 turns on causing current availability from V+ to the $V_{IN}$ supply. $V_{IN}$ provides supply voltage to a voltage regulator IC4. The regulator in turn produces an output fixed at about 3V for the Vcc source, being low voltage for low power consumption by the remaining ICs to perform their function: interval timer IC3, switch status indicator (D11), op-amp circuit IC5 and voltage doubler IC6. When power is first applied to the interval timer IC3, output pin 8 immediately goes high for the duration of the test period delay. Pin 8 provides turn-on voltage to Q7 which sinks current through R30 latching SW1 on in a parallel fashion. This feedback loop maintains uninterrupted supply current for $V_{IN}$ and Vcc for the duration of the test period regardless of subsequent SW1 openings and enclosures. The timing action of IC3 provides a non-traditional usage of integrated oscillator output pin 2. The IC3 count selection is programmed to allow for a relatively slow oscillator period so pin 2 can be used to provide both a voltage level and flash input signal to the status indicator circuit driving D11 bi-color LED. The peak voltage amplitude coming from pin 2 is compared with reference voltage component IC7. When pin 2 peak voltage drops to about 90% of the normal level, the dual op-amp IC5 forward biases the D11 status yellow LED for a flashing indication for recharge. Above this transition point both op-amp outputs transition for a reverse current direction through the D11 to forward bias the status green LED for a flashing indication of adequate storage charge for a "test go." As charge is depleted and tracing voltage sensed at IC3 pin 2 backwards, the sensed level is directly reflective of a voltage level drop of IC3's Vcc supply which begins to occur at the deregulation point of voltage regulator IC4. Lack of adequate input to IC4 results in deregulation which ultimately indicates an inadequate voltage feed coming from the storage capacitors C19-C21.

When a depleting charge causes the status indicator to flash yellow, recharge is necessary; otherwise, as explained earlier, the Vcc supply de-regulates which is the supply voltage to IC6 voltage doubler. As the voltage doubler's Vcc supply input drops, the output magnitude is forced to drop which is the final output for supplying the MAT circuitry 40. The purpose for voltage doubler 106 is to boost the voltage potential from the lower power consumption level of Vcc to match the voltage requirements to drive the MAT circuitry 40 for test. The Mat circuitry 40 requires a greater voltage to overcome multiple (necessary) series component voltage drops and have enough remaining voltage potential to power indicators D1-D10 at a sufficient current level to produce some moderate intensity. The transition point to begin yellow status indication occurs at a specific circuit voltage point but the perceived reduction of intensity from the maximum test level is subjective but minor.

The diagnostic MAT capacitive power source is first regulated then voltage doubled, with the doubled output coming from IC6 pin 1 and current limited by R29. The current passing through R29 is alternated between both the positive and negative MAT circuitry 40. Signal for alternation begins back at IC3. The integrated oscillator on interval timer IC3 is allocated again to provide the alternation signal from pin 2 to control SPST switches (W-Z), the switches making the connection interface. Only three connection points are required for the power interface, a positive input point designated line 1 (D24 anode), a pseudo neutral point designated line 2 (C1-C5 negatives), and a negative input point designated line 3

(D24 cathode). When the D1-D5 section is powered, the power positive connects to line 1 and the power common connects to line 2. However, when the oscillator signal changes state for the D6-D10 section to be powered, the power positive must move to line 2 and the power common must move from line 2 to line 3. Therefore to alternate power, the source positive must alternate between lines 1 & 2 and the source common must alternate between lines 2 and 3 but both at the same time. Switches (W-Z) are interconnected between the source power and the three lines 1-3 to accomplish this alternation action.

Figure 3:
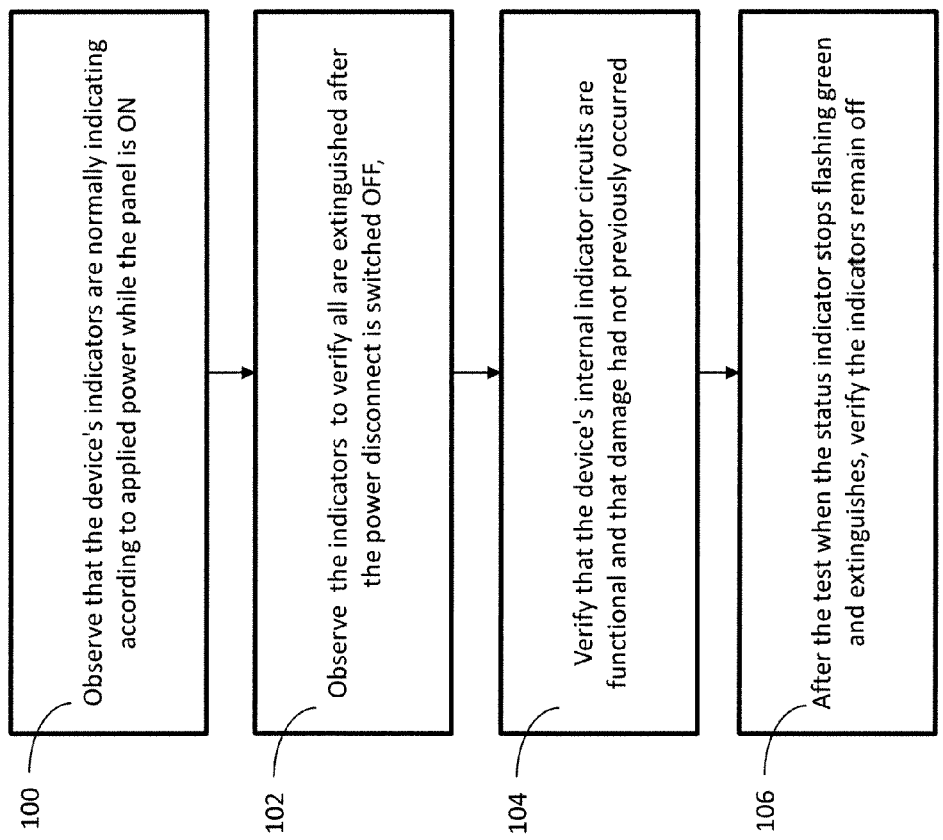
FIG. 3 illustrates a flowchart diagram of the operation of the electrical safety monitor of FIG. 1.

FIG. 3 illustrates the operation of the MAT of the electrical safety monitoring device 20. In order to verify a power panel is in a zero energy state, the reed switch is activated and a first observation is made to observe that the device's indicators are normally indicating according to applied power while the panel is ON in a step 100. Note that "normal" may mean N and GND "+" & "−" indicator pairs are typically extinguished for many common systems. After the power disconnect is switched OFF, a second observation of the indicators is made to verify all are extinguished in a step 102. All extinguished indicators verifies no potential exceeding the minimum detection threshold is occurring between any combination of two or more of input wires or that any remaining DC potential or stored energy is present. DC potentials are typically indicated by illumination of individual "+" or "−" indicators of respective wire input polarity. Before a panel is opened, the devices' operational integrity should be verified, that the device's internal indicator circuits are functional and that damage had not previously occurred, especially for circuits operating indicators normally extinguished in a step 104. This operational test is initiated by momentary magnetic activation of the internal reed switch while a third observation is made to verify all the indicators exhibit illumination during the test. The test period is indicated by the status indicator, bi-color LED D11, flashing Green. After the test when the status indicator stops flashing green and extinguishes, a fourth observation is made to verify the indicators remain off in a step 106. If at any subsequent time one or more indicators illuminate, the electrician should be aware that zero energy is not achieved and possible causes should first be investigated and removed before accessing a panel.

Figure 4:
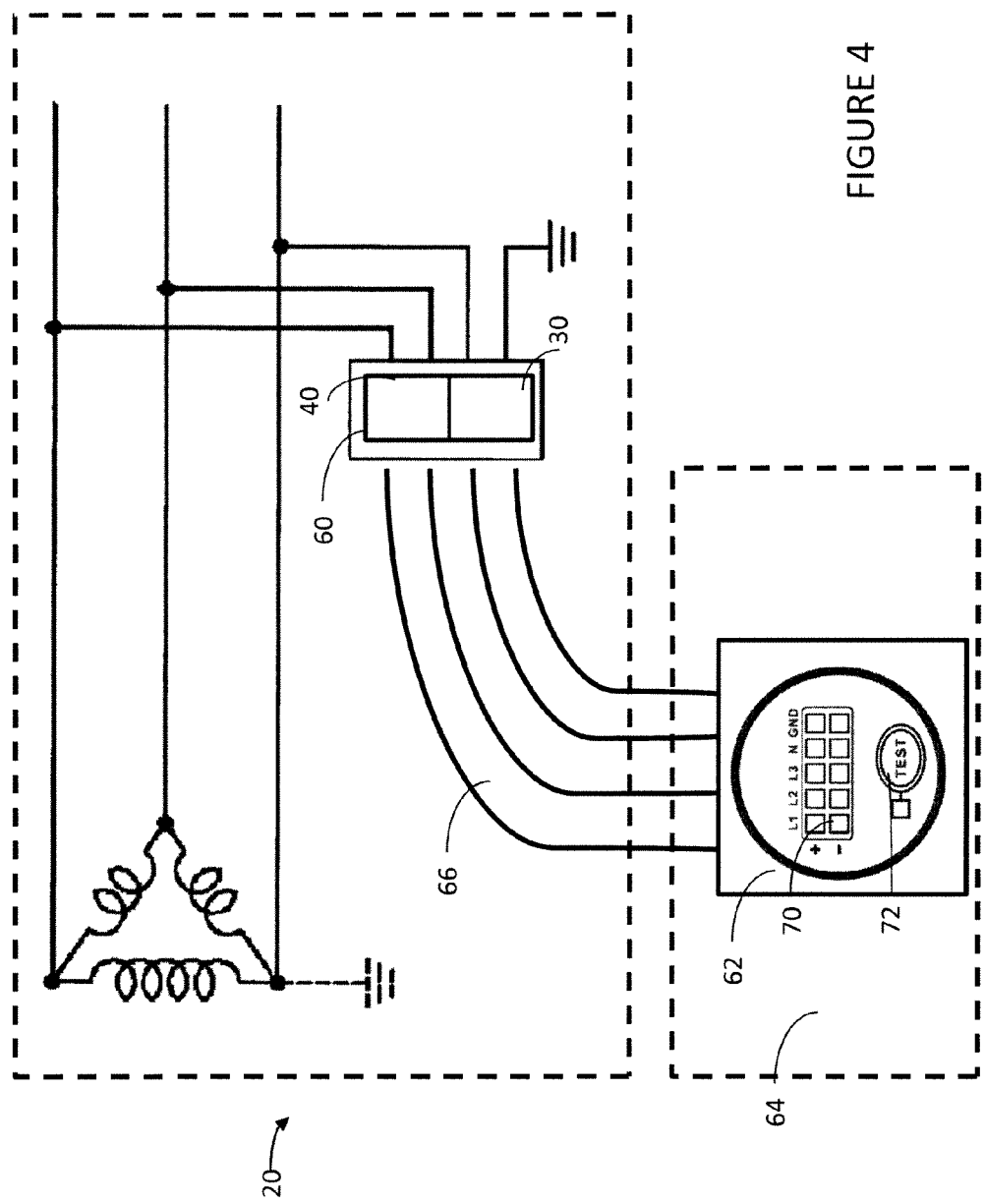
FIG. 4 illustrates an electrical schematic of a three-phase electrical power circuit under service, along with another embodiment of an electrical safety monitoring device.

With reference to FIG. 4, another embodiment of the electrical safety monitor 20 is illustrated. The electrical safety monitor 20 includes an electronics package 60 which is a separate internally mounted package and isolated from a remote display adaptor 62 mounted in a panel knock-out hole 64. A non-conductive fiber-optic cable bundle 66 which is optionally coupled to diodes D1-D11 and varies in length, for example, from 12 to 72 inches. The fiber optic cable bundle 66 has no means of conducting electrical energy to the non-conductive display fitting adaptor and provides high dielectric isolation. This allows electricians to view the indicators using the remote display adaptor such that the danger from electrical potential of the monitored lines is removed. Specifically, the fiber optic cable bundle transmits the light from the LED indicators to corresponding lenses 70 on the remote display adaptor.

In order to limit the diameters of individual fiber optic cable cores and thus the overall bundle diameter, molded lenses in the display adaptor function to expand the diameter of light emanating from ends of the cables to present an indication diameter of adequate size for easier viewing by the user. Reduced cable diameters in turn allow for smaller and tighter bend radius to navigate obstacles within the panel back to the electronics housing module. To maintain adequate light conduction efficiency, fiber-optic coupling grease is applied to both cable ends for "LED-to-core" and "core-to-lense" interfaces. The clear grease possesses a higher index of refraction (about 1.4 to 1.5) than air (about 1) and displaces air in the light path for much improved coupling efficiency. Since grease can flow over time, it is surrounded by thermoset potting compound to prevent migration away from the interface area.

Fiber optic cable is more commonly used to transmit data by pulsing the light at high frequencies over very fine fibers a bit larger than a human hair. Use of cable for flexible visible light pipes to conduct light from commonly available 3 mm LED packages requires much larger core diameters (0.5 mm-3 mm) for adequate overall efficiency. An acceptable indicator display diameter for end user viewing is roughly over 2 mm. An eight cable bundle with core diameters over 2 mm is relatively large and stiff, difficult for installers to bend and route in crowded electrical panels. On the other hand, selecting smaller, more flexible cables with core diameters in a (0.5 mm-1.5 mm) range is inadequate for presenting over a 2 mm indication diameter so lensing magnification was integrated into the display.

In another embodiment, the magnetic reed switch is replaced by a light activated switch. A test lens 72 in the indicator is connected by an optic cable to the switch. In one embodiment, the test is initiated by illuminating the test lens. Alternatively, the test can be initiated by blocking ambient light from reaching the test lens.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. An electrical safety monitor for monitoring electrical energy potentials of one or more electrical power input lines of an A.C. circuit, the electrical safety monitor including:
   one or more detector circuits, each of the detector circuits including:
      one or more capacitors corresponding to one or more electrical power input lines, each capacitor arranged to charge responsive to an electrical energy potential on the corresponding line, and
      one or more pluralities of rectifier diodes which protect the one or more detector circuits and correspond to the one or more capacitors, the one or more pluralities of rectifier diodes limiting voltage over the one or more capacitors in addition to providing charging current of limited voltage to a testing circuit;
   a discharge circuit electrically communicating with the one or more capacitors to cause a capacitor discharge at a predetermined capacitor voltage;
   a plurality of solid-state light-emitting devices disposed in a human-viewable arrangement, each light emitting device electrically communicating with a selected capacitor and producing a light output responsive to capacitor discharge of the corresponding capacitor; and
   the testing circuit arranged to provide a stored test current through each rectifier diode in the one or more detectors circuits providing verification of the electrical safety monitor integrity, wherein the testing circuit provides the stored test current in response to detecting a magnetic field in a vicinity of the electrical safety monitor;
   wherein test current is supplied via three connection inputs including:

a first input coupled to a zener diode anode and a first plurality of rectifier diodes;

a second input coupled to negative terminals of a first group of capacitors; and a third input coupled to a cathode of zener diode and a second plurality of rectifier diodes;

wherein upon one or more of the pluralities of rectifier diodes entering an open state, a corresponding one or more LEDs is not illuminated.

2. The electrical safety monitor as set forth in claim 1, wherein the testing circuit is activated by a presence of a magnetic field in a vicinity of the electrical safety monitor.

3. The electrical safety monitor as set forth in claim 2, wherein the testing circuit further includes:

an internal reed switch which is actuated by the presence of the magnetic field to supply the test current.

4. The electrical safety monitor as set forth in claim 1, wherein the test current is stored on an internal storage capacitance.

5. The electrical safety monitor as set forth in claim 4, wherein the storage capacitance is connected with and charged from the one or more electrical power input lines.

6. The electrical safety monitor as set forth in claim 1, wherein each light emitting device produces a light output responsive to the test current to indicate the integrity of the one or more detector circuits.

7. The electrical safety monitor as set forth in claim 1, further including:

a status light emitting device which indicates the state of the testing circuit.

8. The electrical safety monitor as set forth in claim 7, wherein the status light emitting device indicates at least one of testing duration and adequacy the presence or absence of the test charge stored on the internal storage capacitance.

9. The electrical safety monitor as set forth in claim 1, wherein the testing circuit is configured to provide the test current simultaneously to receiving the electrical energy potentials of one or more electrical power input lines of the A.C. circuit.

10. The electrical safety monitor as set forth in claim 1, further including:

a plurality of optic fibers optically connected with the solid state light emitting devices; and a display device connected with the plurality of optic fibers and electrically isolated from the detector circuits.

11. The electrical safety monitor as set forth in claim 1, wherein the testing circuit further includes:

an optic switch which detects the presence or removal of light; and wherein the testing circuit is activated by the presence or removal of light by the optic switch.

12. The electrical safety monitor as set forth in claim 1, wherein the testing circuit verifies the integrity of each of the one or more detector circuits to the plurality of solid-state light-emitting devices and includes one or more voltage restricting rectifier diodes.

13. An electrical safety monitor for providing warning of a hazardous electrical voltage on a circuit powered by a plurality of electrical power input lines, the safety monitor including:

an electronics package, the electronic package including:
one or more detector circuits, each of the detector circuits including:
one or more capacitors corresponding to one or more electrical power input lines, each capacitor arranged to charge responsive to an electrical energy potential on the corresponding line, and a discharge circuit electrically communicating with the one or more capacitors to cause a capacitor discharge at a predetermined capacitor voltage;

a plurality of solid-state light-emitting devices disposed in a human-viewable arrangement, each light emitting device electrically communicating with a selected capacitor and producing a light output responsive to capacitor discharge of the corresponding capacitor; and a remote display adaptor, the remote display adapter including:

one or more lenses in communication with the plurality of solid-state light-emitting devices via fiber optic cables;

wherein test current is supplied to each rectifier diode in the one or more detector circuits via three connection inputs including:

a first input coupled to a zener diode anode and a first plurality of protection diodes;

a second input coupled to negative terminals of a first group of capacitors; and a third input coupled to a cathode of zener diode and a second plurality of protection diodes;

wherein upon one or more of the first and second pluralities of protection diodes entering an open state, a corresponding one or more LEDs is not illuminated.

14. The safety monitor as set forth in claim 13, wherein the remote display adaptor is electrically isolated from the electronics package.

15. The electrical safety monitor as set forth in claim 13, wherein remote display adapter expands the diameter of light emanating from ends of the cables to present an indication diameter of adequate size for easier viewing by the user.

16. The electrical safety monitor as set forth in claim 13, wherein the fiber optic cables are bundles with core diameters over 0.5 mm.

17. A method for testing operation of an electrical safety monitoring device, the method including:

observing one or more light emitting diode (LED) indicators of the electrical safety monitoring device are normally indicating applied power on one or more monitored electrical lines;

observing one or more LED indicators of the electrical safety monitoring device are extinguished after the applied power is disconnected from the one or more monitored electrical lines; and verifying functionality of the one or more LED indicators by bringing a magnetic field in a vicinity of a testing circuit of the electrical safety monitor and, in response to detecting the magnetic field providing a stored test current through the one or more LED indicators;

providing a visual indication of the status of the verification of the one or more LED indicators;

wherein a test current is supplied by the testing circuit to each rectifier diode in the one or more detector circuits via three connection inputs including:

a first input coupled to a zener diode anode and a first plurality of protection diodes;

a second input coupled to negative terminals of a first group of capacitors; and a third input coupled to a cathode of zener diode and a second plurality of protection diodes;

wherein upon one or more of the first and second pluralities of protection diodes entering an open state, a corresponding one or more LEDs is not illuminated.

18. The method as set forth in claim 17, wherein the presence of the magnetic field is detected by an internal reed switch.

19. The method as set forth in claim 17, further including:
providing the test current from charge stored on an internal storage capacitance.

20. The method as set forth in claim 17, further including:
charging the storage capacitance from the one or more monitored electrical lines.

21. The method as set forth in claim 17, wherein during the step of verifying, the test current passes through the one or more internal circuits in addition to the one or more LED indicators.

22. An electrical safety monitor for monitoring electrical energy potentials of one or more electrical power input lines of an AC circuit, the electrical safety monitor including:
one or more detector circuits, each of the detector circuits including:
one or more capacitors corresponding to one or more electrical power input lines;
one or more protector circuits, each comprising a plurality of rectifier diodes that protect the one or more detector circuits and correspond to the one or more capacitors;
a discharge circuit electrically communicating with the one or more capacitors to cause a capacitor discharge at a predetermined capacitor voltage; and
a plurality of solid-state light-emitting devices disposed in a human-viewable arrangement; and
a testing circuit arranged to provide a stored test current through each rectifier diode in the one or more detector circuits thereby verifying operation of the diodes in the one or more protector circuits, wherein the test current is supplied by the testing circuit via three connection inputs including:
a first input coupled to a zener diode anode and a first plurality of rectifier diodes;
a second input coupled to negative terminals of a first group of capacitors; and
a third input coupled to a cathode of zener diode and a second plurality of rectifier diodes;
wherein upon one or more of the rectifier diodes entering an open state, a corresponding one or more LEDs is not illuminated.

* * * * *